US012660158B2

(12) United States Patent
Jeon et al.

(10) Patent No.: US 12,660,158 B2
(45) Date of Patent: Jun. 16, 2026

(54) SEMICONDUCTOR DEVICE

(71) Applicant: Samsung Electronics Co., Ltd.,
Suwon-si (KR)

(72) Inventors: Intak Jeon, Seoul (KR); Han Jin Lim,
Seoul (KR); Hyung Suk Jung,
Suwon-si (KR); Jae Hyoung Choi,
Hwaseong-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 707 days.

(21) Appl. No.: 17/708,098

(22) Filed: Mar. 30, 2022

(65) Prior Publication Data

US 2023/0061185 A1     Mar. 2, 2023

(30) Foreign Application Priority Data

Aug. 30, 2021     (KR) ........................ 10-2021-0114430

(51) Int. Cl.
H10B 12/00         (2023.01)
(52) U.S. Cl.
CPC ........... H10B 12/315 (2023.02); H10B 12/34
(2023.02)
(58) Field of Classification Search
CPC ....... H10B 12/315; H10B 12/34; H01L 28/60;
H01L 28/40; H01L 28/56
See application file for complete search history.

(56) References Cited

U.S. PATENT DOCUMENTS

| | | | |
|---|---|---|---|
| 8,766,346 B1 | 7/2014 | Rui et al. | |
| 8,846,468 B2 | 9/2014 | Rui et al. | |
| 8,940,388 B2 | 1/2015 | Antonov et al. | |
| 9,536,940 B2 | 1/2017 | Song et al. | |
| 9,923,047 B2 | 3/2018 | Oh et al. | |
| 10,593,777 B2 * | 3/2020 | Kim ..................... | H10B 12/033 |
| 10,964,614 B2 | 3/2021 | Lee et al. | |
| 11,728,311 B2 * | 8/2023 | Ding .................. | H01L 23/5223 |
| | | | 257/668 |
| 2015/0357399 A1 * | 12/2015 | Cho ................. | H01L 21/02192 |
| | | | 257/532 |
| 2019/0096890 A1 * | 3/2019 | Lee ...................... | H10B 12/485 |
| 2019/0148068 A1 * | 5/2019 | Lee ........................ | H01G 4/385 |
| 2020/0168717 A1 * | 5/2020 | Kim ................... | H01L 29/4966 |
| 2020/0176557 A1 * | 6/2020 | Yin ..................... | H01L 23/5226 |

(Continued)

FOREIGN PATENT DOCUMENTS

KR          102193623 B1     12/2020

OTHER PUBLICATIONS

Tuichai et al. (Giant dielectric permittivity and electronic structure
in (A3+, Nb5+) co-doped TiO2 (A=Al, Ga, and In), Ceramics
International 43 S265-S269 (2017)) (Year: 2017).*

(Continued)

*Primary Examiner* — Steven H Loke
*Assistant Examiner* — Jaesun Lee
(74) *Attorney, Agent, or Firm* — Muir Patent Law, PLLC

(57)          ABSTRACT

A semiconductor device is provided. The semiconductor
device comprises a lower electrode, a lower dielectric layer
on the lower electrode, an upper electrode on the lower
dielectric layer, an upper dielectric layer formed between the
lower dielectric layer and the upper electrode, and an
interposed electrode film formed between the lower dielec-
tric layer and the upper dielectric layer, wherein the upper
dielectric layer includes titanium oxide.

16 Claims, 14 Drawing Sheets

(56) References Cited

U.S. PATENT DOCUMENTS

| | | | |
|---|---|---|---|
| 2020/0258690 A1* | 8/2020 | Tsunoda | H01G 4/1209 |
| 2021/0142946 A1 | 5/2021 | Kang et al. | |
| 2023/0080939 A1* | 3/2023 | Lee | H01L 23/5329 |
| | | | 257/635 |

OTHER PUBLICATIONS

Cannulescu et al. (Band gap tuning of amorphous Al oxides by Zr alloying, Appl. Phys. Lett. 109, 091902 (2016)) (Year: 2016).*

* cited by examiner

Concentration of first metal

A                                                    B

SEMICONDUCTOR DEVICE

CROSS-REFERENCE TO RELATED APPLICATION

This application claims priority under 35 U.S.C. § 119 from Korean Patent Application No. 10-2021-0114430, filed on Aug. 30, 2021, in the Korean Intellectual Property Office, and all the benefits accruing therefrom under 35 U.S.C. § 119, the entire contents of which are herein incorporated by reference.

BACKGROUND

Field

The present disclosure relates to a semiconductor device.

Description of Related Art

A semiconductor element is being used in many electronic industry fields due to characteristics thereof such as miniaturization, multifunctionality, and/or low manufacturing cost. The semiconductor element may include a memory element that stores data therein, a logic element that computes and processes data, and a hybrid element that may simultaneously perform various functions.

As the electronic industry develops, demand for high integration of the semiconductor element is increasing. Accordingly, various problems such as decrease in a process margin of an exposure process that defines fine patterns occur, thereby making it increasingly difficult to implement the semiconductor element. Further, with the development of the electronic industry, demand for a high-speed semiconductor element is increasing. Various studies are being conducted to satisfy the demands for the high integration and/or the high speed of the semiconductor element.

SUMMARY

A technical purpose of the present disclosure is to provide a semiconductor device capable of improving performance and reliability.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to some aspects of the present inventive concept, there is provided a semiconductor device comprising a lower electrode, a lower dielectric layer on the lower electrode, an upper electrode on the lower dielectric layer, an upper dielectric layer formed between the lower dielectric layer and the upper electrode, and an interposed electrode film formed between the lower dielectric layer and the upper dielectric layer, wherein the upper dielectric layer includes titanium oxide.

According to some aspects of the present inventive concept, there is provided a semiconductor device comprising a first dielectric layer, a first conductive layer disposed on the first dielectric layer and in contact with the first dielectric layer, a second dielectric layer disposed on the first conductive layer and in contact with the first conductive layer, and a second conductive layer disposed on the second dielectric layer and in contact with the second dielectric layer, wherein each of the first conductive layer and the second conductive layer includes titanium nitride (TiN), wherein the first dielectric layer includes at least one of zirconium oxide, hafnium oxide, or aluminum oxide, and wherein the second dielectric layer includes titanium oxide.

According to some aspects of the present inventive concept, there is provided a semiconductor device comprising a substrate, a trench defined in the substrate, a gate electrode filling a portion of the trench, a buried contact disposed on at least one side of the gate electrode and connected to the substrate, a landing pad disposed on the buried contact, and a capacitor connected to the landing pad, wherein the capacitor includes a lower electrode including a first side wall and a second side wall opposite to each other, a lower dielectric layer extending along the first side wall, the second side wall and a top surface of the lower electrode, an interposed electrode film disposed on the lower dielectric layer, wherein the interposed electrode film is in contact with the lower dielectric layer and extends along a profile of the lower dielectric layer, an upper dielectric layer disposed on the interposed electrode film, wherein the upper dielectric layer is in contact with the interposed electrode film and extends along a profile of the interposed electrode film, and an upper electrode disposed on the upper dielectric layer and covering the upper dielectric layer, and wherein the upper dielectric layer includes titanium oxide.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTIONS

Figure 1:
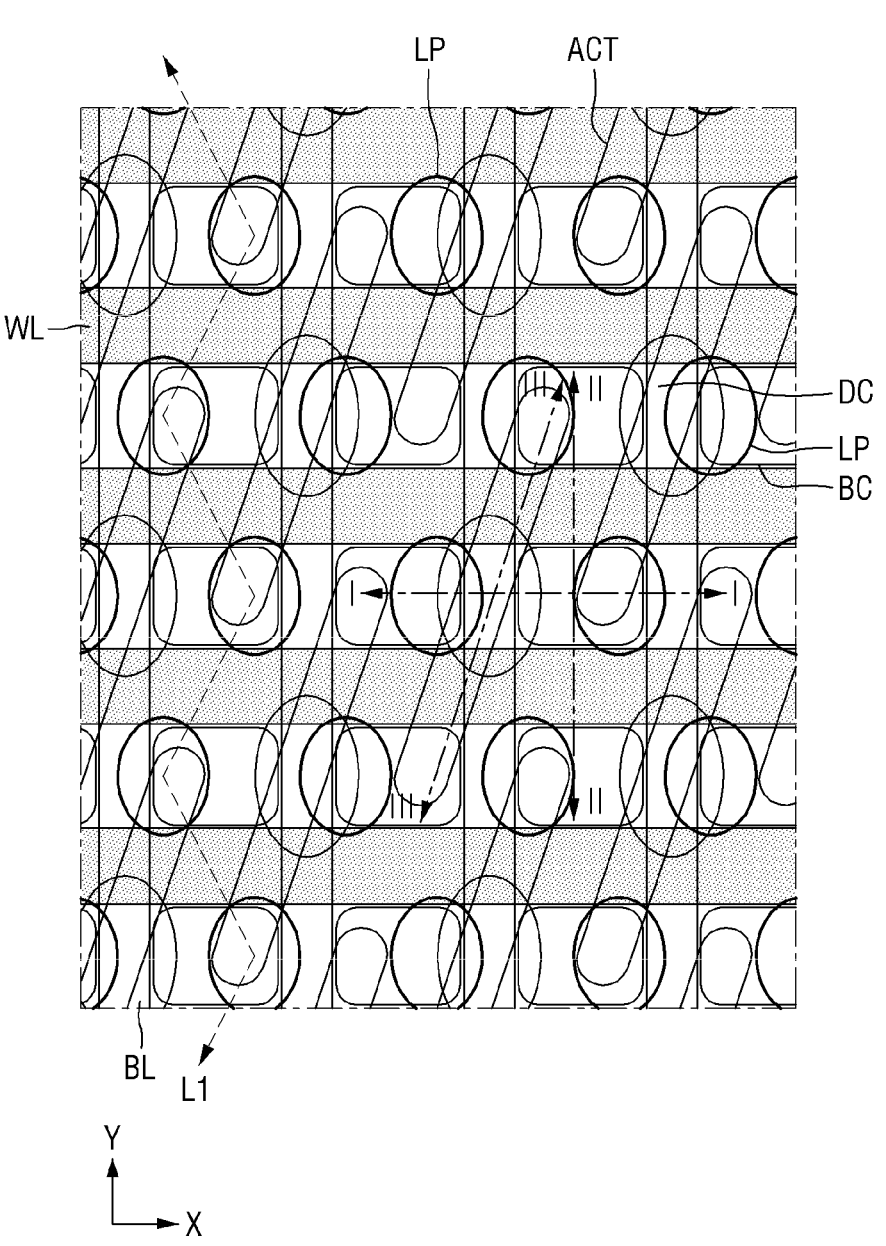
FIG. 1 is a schematic layout of a semiconductor device, according to example embodiments of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. The term "contact," as used herein, refers to a direct connection (i.e., touching) unless the context indicates otherwise.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction X", "second direction Y" and "third direction Z" should not be interpreted only to have a geometric relationship in which the first direction, the second direction, and the third direction are perpendicular to each other. The "first direction X", "second direction Y" and "third direction Z" may be interpreted to have a broader direction within a range in which components herein may work functionally.

Hereinafter, embodiments of the present disclosure will be described in detail with reference to the accompanying drawings. The same reference numerals are used for the same components in the drawings, and duplicate descriptions thereof are omitted.

Hereinafter, a semiconductor device according to example embodiments will be described with reference to FIGS. 1 to 5.

Figure 2:
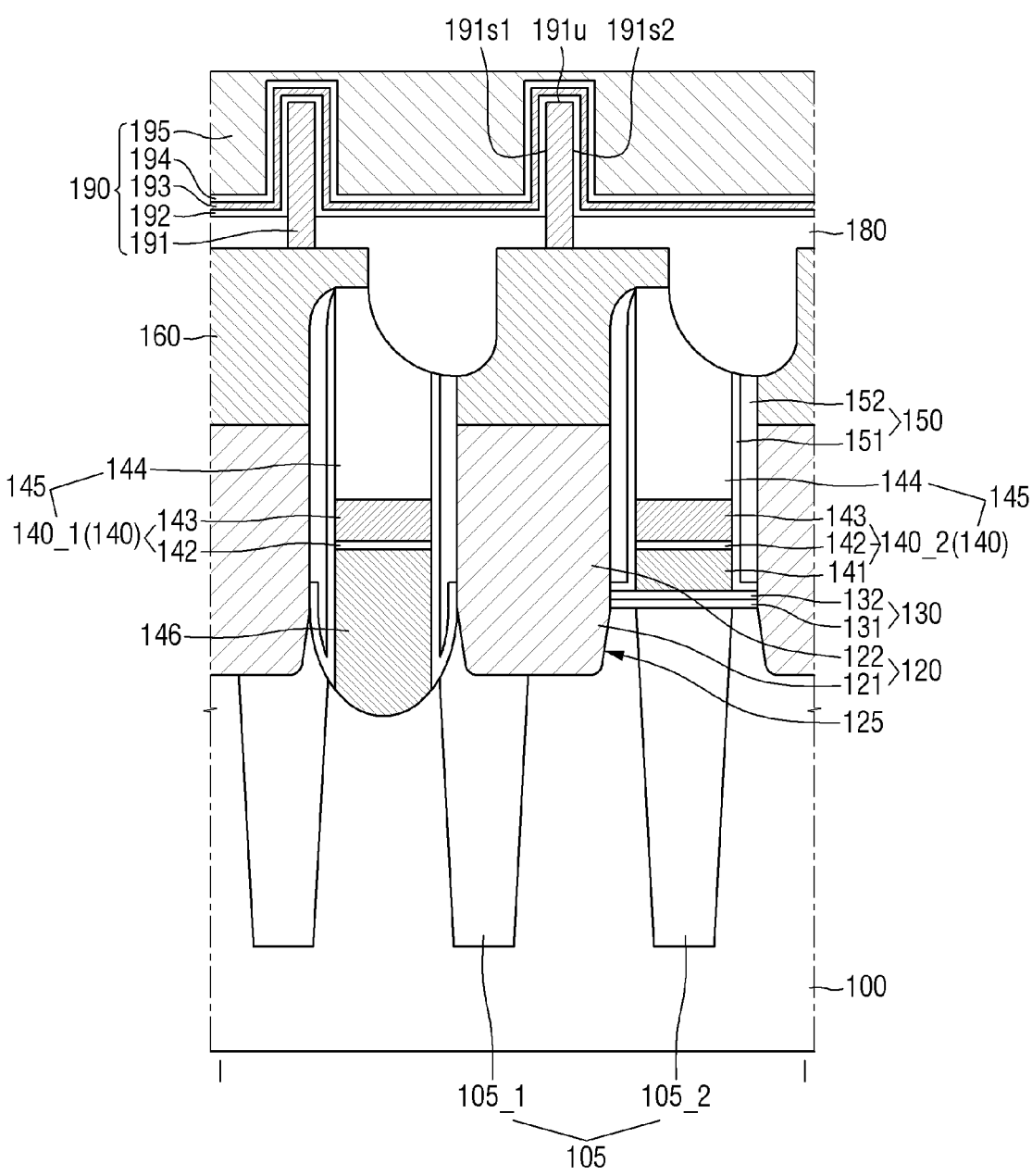
FIG. 2 is an example of a cross-sectional view taken along a line I-I of FIG. 1.
Figure 3:
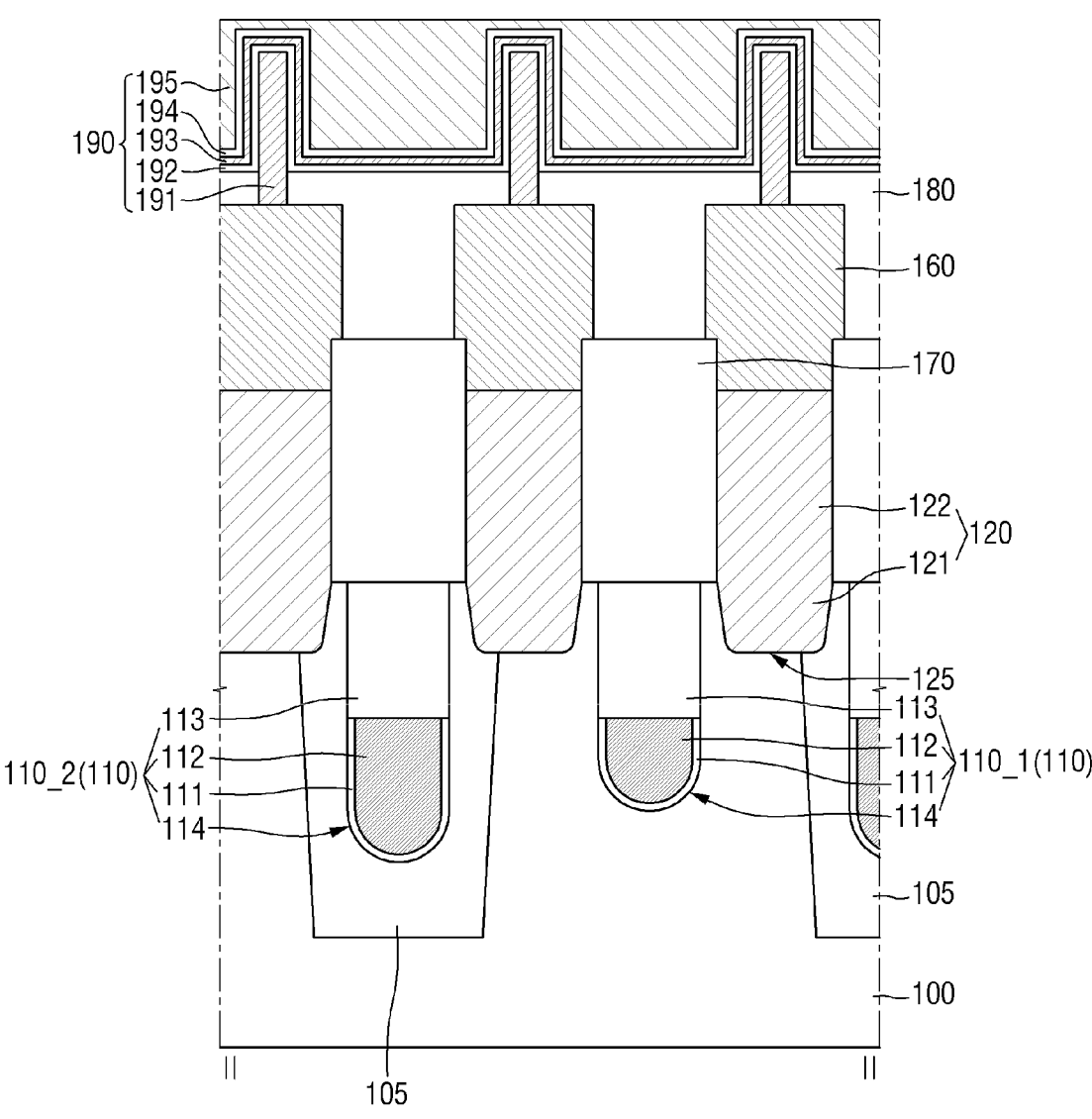
FIG. 3 is an example of a cross-sectional view taken along a line II-II of FIG. 1.
Figure 4:
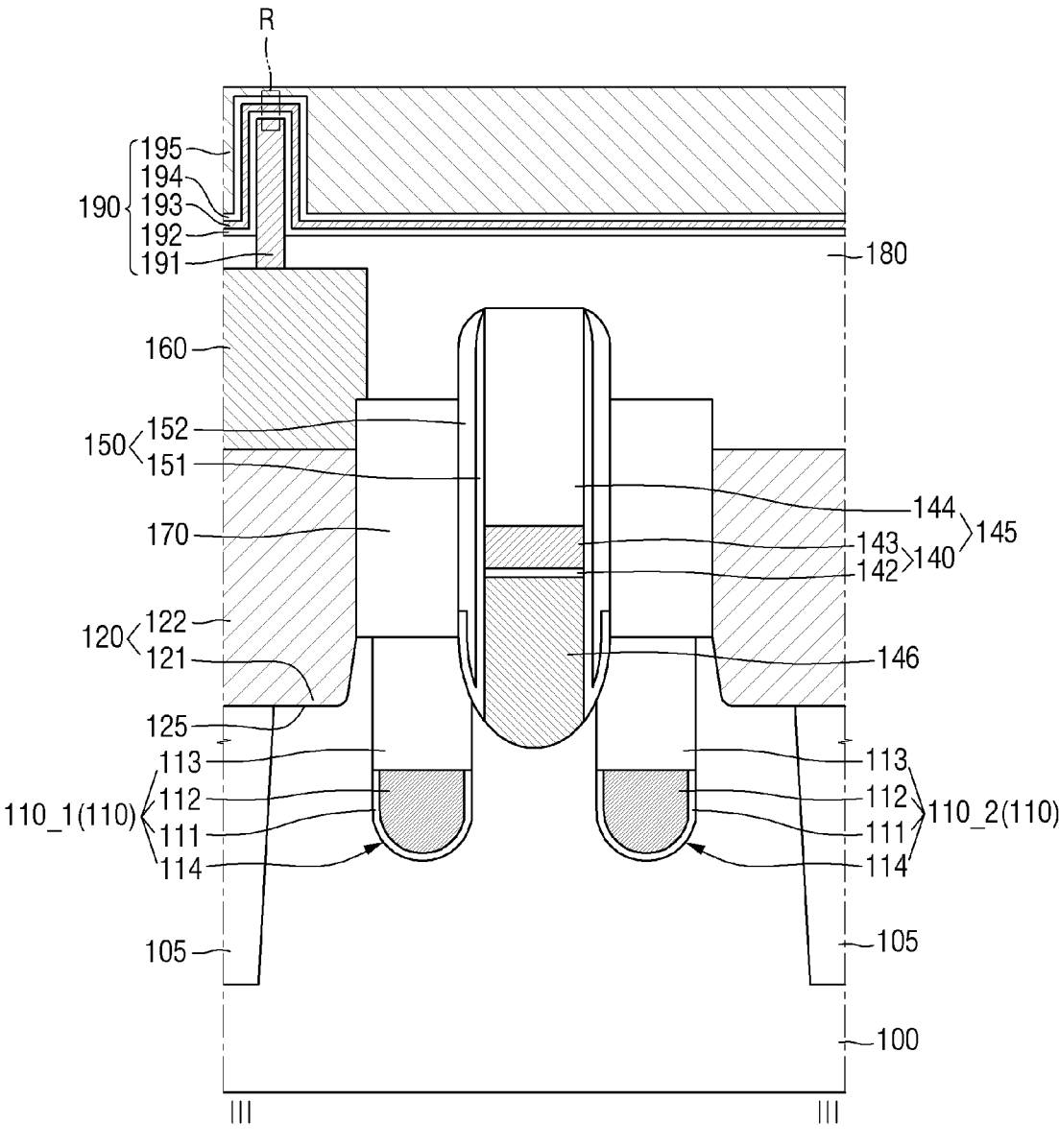
FIG. 4 is an example of a cross-sectional view taken along a line III-III of FIG. 1.
Figure 5:
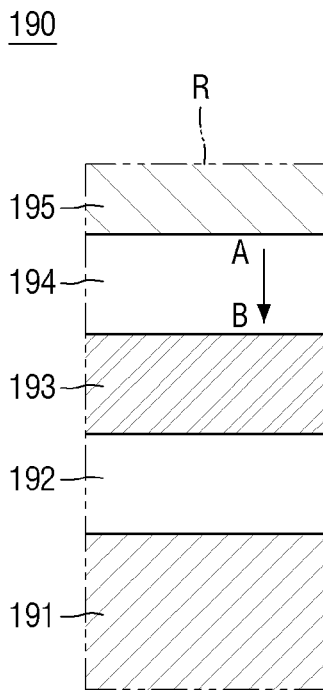
FIG. 5 is an example of an enlarged view showing area R of FIG. 4.
Figure 6:
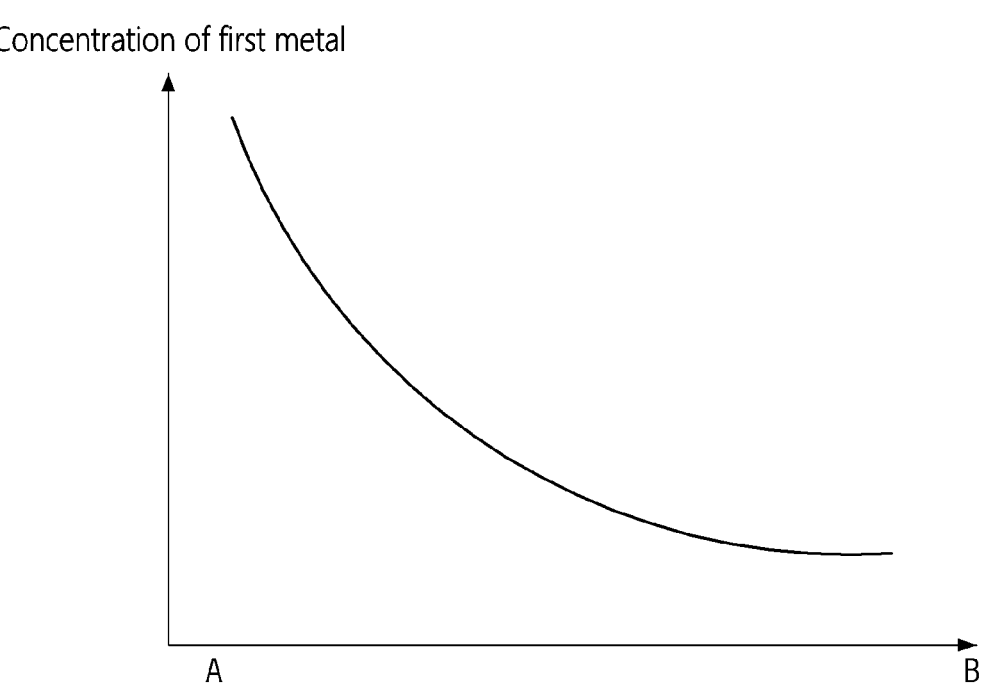
FIG. 6 and FIG. 7 are graphs for illustrating concentrations of a first metal and a second metal distributed along A-B of FIG. 5.
Figure 7:
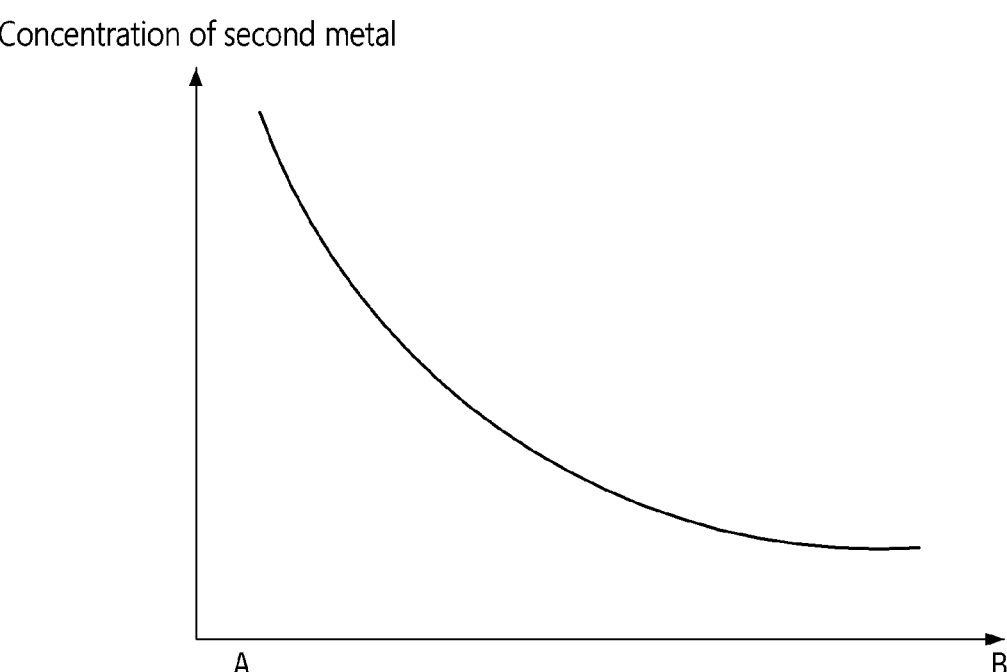

FIG. 1 is a schematic layout of a semiconductor device according to some embodiments of the present disclosure. FIG. 2 is an example of a cross-sectional view taken along a line I-I of FIG. 1. FIG. 3 is an example of a cross-sectional view taken along a line II-II of FIG. 1. FIG. 4 is an example of a cross-sectional view taken along a line III-III of FIG. 1. FIG. 5 is an example of an enlarged view showing area R of FIG. 4. FIG. 6 and FIG. 7 are graphs for illustrating concentrations of a first metal and a second metal distributed along A-B of FIG. 5.

In the drawings related to a semiconductor device according to example embodiments of the present disclosure, a DRAM (Dynamic Random Access Memory) is shown by way of example. The present disclosure is not limited thereto.

Referring to FIG. 1, the semiconductor device according to example embodiments of the present disclosure may include a plurality of active areas ACT. The active area ACT may be defined by an element separation film (e.g., element separation film 105 in FIG. 2) formed within a substrate (e.g., substrate 100 in FIG. 2).

As a design rule of a semiconductor device is reduced, the active area ACT may extend in a form of a bar extending in a diagonal line or an oblique line as shown. A plurality of gate electrodes may be disposed on the active area ACT so as to extend lengthwise in a first direction X and across the active area ACT. The plurality of gate electrodes may extend in a parallel manner to each other. The plurality of gate electrodes may act as, for example, a plurality of word-lines WL.

The word-lines WL may be arranged to be spaced apart from each other by an equal spacing. A width of the word-line WL or a spacing between word-lines WL may be determined according to the design rule.

A plurality of bit-lines BL extending lengthwise in a second direction Y orthogonal to the word-line WL may be disposed on the word-line WL. The plurality of bit-lines BL may extend in a parallel manner to each other.

The bit-lines BL may be arranged to be spaced apart from each other by an equal spacing. A width of the bit-line BL or a spacing between bit-lines BL may be determined according to the design rule.

In some embodiments, each bit-line BL may have a pitch of 3 F. Further, each word-line WL may have a pitch of 2 F.

In this connection, F may mean a minimum lithographic feature size. When the bit-line BL and the word-line WL respectively have the pitches as described above, the semiconductor device may include a memory cell having a unit cell size of 6 $F^2$.

The semiconductor device according to some embodiments of the present disclosure may include various contact arrangements formed on the active area ACT. The various contact arrangements may include, for example, a direct contact DC, a buried contact BC, and a landing pad LP.

In this connection, the direct contact DC may mean a contact that electrically connects the active area ACT to the bit-line BL. The buried contact BC may mean a contact connecting the active area ACT to a lower electrode (e.g., lower electrode 191 of FIG. 2) of a capacitor.

Due to an arrangement structure, a contact area between the buried contact BC and the active area ACT may be small. Accordingly, a conductive landing pad LP may be introduced to increase a contact area with the lower electrode (e.g., lower electrode 191 of FIG. 2) of the capacitor along with increasing a contact area with the active area ACT.

The landing pad LP may be disposed between the active area ACT and the buried contact BC and may be disposed between the buried contact BC and the lower electrode of the capacitor. In the semiconductor device according to some embodiments of the present disclosure, the landing pad LP may be disposed between the buried contact BC and the lower electrode of the capacitor. Increasing the contact area via the introduction of the landing pad LP may allow a contact resistance between the active area ACT and the lower electrode of the capacitor to be reduced.

In the semiconductor device according to some embodiments of the present disclosure, direct contact DC may be disposed on a middle portion of the active area ACT. The buried contact BC may be disposed on each of both opposing ends of the active area ACT.

As the buried contact BC is disposed on each of both opposing ends of the active area ACT, the landing pad LP may be disposed adjacent to each of both opposing ends of the active area ACT and partially overlap the buried contact BC.

In other words, the buried contact BC may be formed to overlap the active area ACT and the element separation film (e.g., element separation film 105 in FIG. 2) between adjacent word-lines WL and between adjacent bit-lines BL.

The word-line WL may be formed as a structure buried in the substrate 100. The word-line WL may extend across a portion of the active area ACT between adjacent direct contacts DC or adjacent buried contacts BC.

As shown, two word-lines WL may extend across one active area ACT. Because the active area ACT extends in the oblique line, an angle between the word-line WL and the active area ACT may be smaller than 90 degrees.

The direct contacts DC may be symmetrically arranged. The buried contacts BC may be symmetrically arranged. Thus, the direct contacts DC may be arranged in a straight line along each of the first direction X and the second direction Y. The buried contacts BC may be arranged in a straight line along each of the first direction X and the second direction Y.

Unlike the direct contacts DC and the buried contacts BC, the landing pads LP may be arranged in a zigzag manner L1 in the second direction Y in which the bit-line BL extends. Further, the landing pads LP may be arranged in the first direction X in which the word-line WL extends so as to overlap the same side portions of corresponding bit-lines BL, respectively.

For example, the landing pads LP arranged in a first line in the first direction may overlap left side portions of corresponding bit-lines BL, respectively. The landing pads LP arranged in a second line in the first direction may overlap right side portions of corresponding bit-lines BL, respectively.

Referring to FIG. 1 to FIG. 5, the semiconductor device according to some embodiments of the present disclosure may include the element separation film 105, a plurality of gate structures 110, a plurality of line conductive films 140, a bit-line contact 146, a storage contact 120, and a capacitor 190.

A substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide, or gallium antimonide, but may not limited thereto. For convenience of illustration, an example in which the substrate 100 is embodied as the silicon substrate is described below.

The element separation film 105 may be formed in the substrate 100. The element separation film 105 may have an STI (shallow trench isolation) structure with excellent element separation ability. The element separation film 105 may define the active area ACT within the substrate 100.

The active area ACT defined by the element separation film 105 may have an elongate island shape including a minor axis and a major axis as shown in FIG. 1. The active area ACT may have an oblique shape to define an angle smaller than 90 degrees with respect to the word-line WL formed in the element separation film 105. Further, the active area ACT may have an oblique shape to define an angle smaller than 90 degrees with respect to the bit-line BL formed on the element separation film 105. For example, the active area ACT may extend lengthwise in a third direction extending at a predefined angle with respect to each of the first direction X and the second direction Y.

The element separation film 105 may include, for example, at least one of a silicon oxide film, a silicon nitride film, and a silicon oxynitride film. The present disclosure is not limited thereto. In the semiconductor device according to example embodiments of the present disclosure, an example in which the element separation film 105 includes the silicon oxide film is described.

In FIG. 2 to FIG. 4, the element separation film 105 is shown to be composed of one insulating film. However, this is only for convenience of illustration. The present disclosure is not limited thereto.

In FIG. 3 and FIG. 4, a top surface of the element separation film 105 and a top surface of the substrate 100 are shown to be coplanar with each other. However, this is only for convenience of illustration. The present disclosure is not limited thereto.

The gate structure 110 may be formed in the substrate 100 and the element separation film 105. The gate structure 110 may extend across the element separation film 105 and the active area ACT defined by the element separation film 105. For example, one gate structure 110 may be formed in a portion of the substrate 100 and a portion of the element separation film 105 extending in the direction X in which the gate structure 110 extends.

In FIG. 3 as a cross-section cut along the second direction Y of a portion between adjacent bit-lines BL of FIG. 1, one of adjacent first and second gate structures 110_1 and 110_2 may be formed in the element separation film 105, while the other thereof may be formed in the substrate 100.

Further, in FIG. 4 as a cross-section cut along in a direction in which the active area ACT extends, the adjacent first and second gate structures 110_1 and 110_2 may be formed in the substrate 100 and in one active area ACT defined by the element separation film 105.

The gate structure 110 may include a gate trench 114 formed in each of the substrate 100 and the element separation film 105, a gate insulating film 111, a gate electrode 112, and a gate capping pattern 113. In this connection, the gate electrode 112 may correspond to the word-line WL.

The gate insulating film 111 may extend along a side wall and a bottom surface of the gate trench 114. The gate insulating film 111 may extend along a profile of at least portion of the gate trench 114.

The gate insulating film 111 may include silicon oxide, silicon nitride, silicon oxynitride, or a high dielectric constant material having a dielectric constant higher than that of the silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. The present disclosure is not limited thereto.

Although the above-described high dielectric constant material has been described based on oxide, the high dielectric constant material may include at least one of nitride (e.g., hafnium nitride) of the above-described metallic material (e.g., hafnium) or oxynitride (e.g., hafnium oxynitride) thereof. The present disclosure is not limited thereto.

The gate electrode 112 may be formed on the gate insulating film 111. The gate electrode 112 may fill a portion of the gate trench 114.

The gate electrode 112 may include, for example, at least one of titanium nitride (TiN), tantalum carbide (TaC), tantalum nitride (TaN), titanium silicon nitride (TiSiN), tantalum silicon nitride (TaSiN), or tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The gate electrode 112 may include a conductive metal oxide, a conductive metal oxynitride, and the like. The gate electrode 112 may include an oxidized product of a material having metallic properties among the above-mentioned materials.

The gate capping pattern 113 may be formed on the gate electrode 112. The gate capping pattern 113 may fill a remaining portion of the gate trench 114 in which the gate electrode 112 has been formed. The gate capping pattern 113 may include, for example, at least one of silicon nitride (SiN), silicon oxynitride (SiON), silicon oxide (SiO₂), silicon carbonitride (SiCN), silicon oxycarbonitride (SiOCN), and combinations thereof.

In FIG. 3 and FIG. 4, a top surface of the gate capping pattern 113, a top surface of the element separation film 105, and a top surface of the substrate 100 are shown to be coplanar with each other. However, this is only for convenience of illustration. The present disclosure is not limited thereto.

Further, the gate insulating film 111 is shown not to extend along a side wall of the gate capping pattern 113. The present disclosure is not limited thereto.

In FIG. 3, the lowermost level of the first gate structure 110_1 formed in the substrate 100 may be different from the lowermost level of the second gate structure 110_2 formed in the element separation film 105. For example, a distance from the capacitor 190 to a bottom of the first gate structure 110_1 may be smaller than a distance from the capacitor 190 to a bottom of the second gate structure 110 2.

In a process of forming the gate trench 114, an etch rate of the substrate 100 and an etch rate of the element separation film 105 are different from each other. Thus, the lowermost level of the first gate structure 110_1 formed in the substrate 100 may be different from the lowermost level of the second gate structure 110 2 formed in the element separation film 105.

Although not shown, the first and second gate structures 110_1 and 110_2 extend across the substrate 100 and the element separation film 105. Thus, a bottom surface of each of the first and second gate structures 110_1 and 110_2 may have an alternate arrangement of peak and valley points in which a distance from the peak point to the capacitor 190 is smaller than a distance from the valley point thereto.

Although not shown, an impurities doping area may be formed on at least one side of the gate structure 110. The impurities doping area may act as a source/drain area of a transistor.

The line conductive film 140 may be formed on the substrate 100 and the element separation film 105 in which the gate structure 110 has been formed. The line conductive film 140 may intersect the element separation film 105 and the active area ACT defined by the element separation film 105.

For example, one line conductive film 140 may be formed on a portion of the substrate 100 and a portion of the element separation film 105 extending in the direction Y in which the line conductive film 140 extends. The line conductive film 140 may extend to intersect the gate structure 110. In this connection, the line conductive film 140 may correspond to the bit-line BL.

The line conductive film 140 may be a single-layer film, or may be a multilayer film as shown. When the line conductive film 140 is embodied as the multilayer film, the line conductive film 140 may include, for example, a first conductive film 141, a second conductive film 142, and a third conductive film 143. The present disclosure is not limited thereto. The first to third conductive films 141, 142, and 143 may be sequentially stacked on the substrate 100 and the element separation film 105.

Each of the first to third conductive films 141, 142, and 143 may include, for example, at least one of a semiconductor material doped with impurities, a conductive silicide compound, a conductive metal nitride, and a metal. For example, the first conductive film 141 may include a doped semiconductor material, the second conductive film 142 may include a conductive silicide compound, and the third conductive film 143 may include at least one of a conductive metal nitride and a metal. The present disclosure is not limited thereto.

The bit-line contact 146 may be formed between the line conductive film 140 and the substrate 100. For example, the line conductive film 140 may be formed on the bit-line contact 146.

For example, the bit-line contact 146 may be formed at a point where the line conductive film 140 intersects a middle portion of the active area ACT having an elongate island shape. The bit-line contact 146 may be formed between the substrate 100 and the line conductive film 140 and in the middle portion of the active area ACT.

The bit-line contact 146 may electrically connect the line conductive film 140 and the substrate 100 to each other. More specifically, the bit-line contact 146 may electrically connect the impurities doping area of the substrate 100 between adjacent gate structures 110 to the line conductive film 140. In this connection, the bit-line contact 146 may correspond to the direct contact DC.

For example, in FIG. 4, a depth from a level of a top surface of the gate structure 110 to a level of a bottom surface of the bit-line contact 146 is smaller than a depth from the level of the top surface of the gate structure 110 to a level of a bottom surface of the gate capping pattern 113.

The bit-line contact 146 may include, for example, at least one of a semiconductor material doped with impurities, a conductive silicide compound, a conductive metal nitride, and a metal.

In FIG. 2 as a cross section cut along the first direction X of a portion between adjacent word-lines WL in FIG. 1, one of adjacent first and second line conductive films 140_1 and 140_2 may be formed on the element separation film 105, while the other thereof may be formed on a portion of the substrate 100 as the active area ACT defined by the element separation film 105.

In the cross-sectional view taken in the first direction X, the element separation film 105 and the active area ACT included in the substrate 100 may be disposed between the adjacent first and second line conductive films 140_1 and 140_2.

The second line conductive film 140_2 on the element separation film 105 in which the bit-line contact 146 is not formed may include first to third conductive films 141, 142, and 143. The first line conductive film 140_1 on a portion of the substrate 100 in which the bit-line contact 146 is formed may include, for example, the second conductive film 142 and the third conductive film 143. This is because a portion of the bit-line contact 146 may be disposed at a position where the first conductive film 141 of the second line conductive film 140_2 is formed.

In one example, a first line conductive film 140_1 on the element separation film 105 in which the bit-line contact 146 is not formed among first line conductive films 140_1 extending in the second direction Y may include the first to third conductive films 141, 142, and 143 as in the second line conductive film 140_2.

The bit-line contact 146 may include, for example, at least one of a semiconductor material doped with impurities, a conductive silicide compound, a conductive metal nitride, and a metal. For example, the bit-line contact 146 may include the semiconductor material doped with impurities. The present disclosure is not limited thereto.

The line capping film 144 may be disposed on the line conductive film 140 and extend in the second direction Y. In this connection, the line capping film 144 may include a silicon nitride film. The present disclosure is not limited thereto.

The line conductive film 140 and the line capping film 144 may be included in a bit-line structure 145. A portion between adjacent bit-line structures 145 may vertically overlap the substrate 100 and the element separation film 105.

A cell insulating film 130 may be formed on the substrate 100 and the element separation film 105. More specifically, the cell insulating film 130 may be formed on a portion of the substrate 100 and the element separation film 105 in which the bit-line contact 146 is not formed. The cell insulating film 130 may be formed between the substrate 100 and the line conductive film 140 and between the element separation film 105 and the line conductive film 140.

The cell insulating film 130 may be a single-layer film. Alternatively, as shown, the cell insulating film 130 may be a multi-layer film including a first cell insulating film 131 and a second cell insulating film 132. For example, the first cell insulating film 131 may include an oxide film, and the second cell insulating film 132 may include a nitride film. The present disclosure is not limited thereto.

A line spacer 150 may be disposed on a side wall of each of the line conductive film 140 and the line capping film 144. Specifically, the line spacer 150 may be formed on the substrate 100 and the element separation film 105 and on a portion of the line conductive film 140 in which the bit-line contact 146 is formed. The line spacer 150 may extend in the second direction Y and on the side wall of each of the line conductive film 140 and the line capping film 144.

However, the line spacer 150 may be formed on the cell insulating film 130 and on a remaining portion of the line conductive film 140 in which the bit-line contact 146 is not formed. For example, the line spacer 150 may contact a top surface of the cell insulating film 130.

The line spacer 150 may be embodied as a single-layer film. However, as illustrated in the drawing, the line spacer 150 may be embodied as a multilayer film including a first spacer 151 and a second spacer 152. For example, each of the first and second spacers 151 and 152 may include one of a silicon oxide film, a silicon nitride film, a silicon oxynitride film (SiON), a silicon oxycarbonitride film (SiOCN), air, and a combination thereof. The present disclosure is not limited thereto.

A first interlayer insulating film 170 may be formed on the substrate 100 and the element separation film 105. The first interlayer insulating film 170 may be formed to overlap the gate structure 110 formed in each of the substrate 100 and the element separation film 105.

The first interlayer insulating film 170 may be formed on the gate structure 110, and may extend along the first direction X. The first interlayer insulating film 170 may intersect the bit-line structure 145 extending in the second direction Y. A portion between adjacent first interlayer insulating films 170 may vertically overlap the substrate 100 and the element separation film 105. The first interlayer insulating film 170 may contact top surfaces of the gate capping pattern 113, the element separation film 105, and the substrate 100 and side surfaces of the storage contact 120, the line spacer 150, and a storage pad 160.

The first interlayer insulating film 170 may include, for example, at least one of silicon oxide, silicon nitride, silicon oxynitride, and a combination thereof. Although the first interlayer insulating film 170 is shown as a single-layer film, this is only for convenience of illustration. The present disclosure is not limited thereto.

In FIG. 4, a vertical level of a top surface of the first interlayer insulating film 170 is shown to be lower than a vertical level of a top surface of the bit-line structure 145. The present disclosure is not limited thereto.

A buried contact recess 125 may be formed in the substrate 100 and the element separation film 105 and between adjacent gate structures 110 and between adjacent line conductive films 140. The buried contact recess 125 may be formed in the substrate 100 and the element separation film 105 so as to occupy a boundary therebetween. The buried contact recess 125 may be connected to the substrate 100.

The buried contact recess 125 may be formed at at least one side around the gate structure 110. Further, the buried contact recess 125 may be formed at at least one side around the line conductive film 140.

In the cross-sectional view shown by FIG. 2, the element separation film 105 may include a first area 105_1 and a second area 105_2. The first area 105_1 of the element separation film 105 and the second area 105_2 of the element separation film 105 may be adjacent to each other and may be spaced apart from each other. The first line conductive film 140_1 connected to the bit-line contact 146 among the adjacent first and second line conductive films 140_1 and 140_2 may be formed on the substrate 100. The second line conductive film 140_2 may be formed on the second area 105_2 of the element separation film 105.

A portion of the substrate 100 and the first area 105_1 of the element separation film 105 may be disposed between the adjacent first and second line conductive films 140_1 and 140_2. In FIG. 2, the buried contact recess 125 may be formed in a portion of the first area 105_1 of the element separation film 105 and in a portion of the substrate 100 between the first area 105_1 of the element separation film 105 and the second area 105_2 of the element separation film 105.

A depth from a level of the top surface of the substrate 100 to a level of a bottom surface of the buried contact recess 125 may be smaller than a depth from the level of the top surface of the substrate 100 to a level of a bottom surface of the bit-line contact 146.

Further, a depth from a level of the top surface of the substrate 100 to a level of the bottom surface of the buried contact recess 125 may be smaller than a depth from the level of the top surface of the substrate 100 to a level of a top surface of the gate electrode 112. Alternatively, a depth from a level of the top surface of the gate structure 110 to a level of the bottom surface of the buried contact recess 125 may be smaller than a depth from the level of the top surface of the gate structure 110 to a level of a top surface of the gate electrode 112.

The storage contact 120 may be formed between adjacent gate structures 110 and between adjacent line conductive films 140. The storage contact 120 may overlap the substrate 100 and the element separation film 105 while being disposed between the adjacent gate structures 110 and between the adjacent line conductive films 140. The gate structure 110 may be positioned between the storage contact 120 and the bit-line contact 146. In this connection, the storage contact 120 may correspond to the buried contact BC.

The storage contact 120 may fill the buried contact recess 125. Further, the storage contact 120 may include a portion extending along a side wall of the line spacer 150 and a side wall of the first interlayer insulating film 170.

The storage contact 120 may include a lower portion 121 and an upper portion 122. The lower portion 121 of the storage contact 120 may fill the buried contact recess 125. For example, the lower portion 121 of the storage contact 120 may be formed in the substrate 100 and the element separation film 105. The upper portion 122 of the storage contact is formed on the lower portion 121 of the storage contact 120. The upper portion 122 of the storage contact 120 may extend along the side wall of the line spacer 150 and the side wall of the first interlayer insulating film 170.

The storage contact 120 may include, for example, at least one of a semiconductor material doped with impurities, a conductive silicide compound, a conductive metal nitride, and a metal.

A storage pad 160 may be formed on the storage contact 120. The storage pad 160 may be electrically connected to the storage contact 120. In some embodiments, a lower surface of the storage pad 160 may contact a top surface of the storage contact 120. In this connection, the storage pad 160 may correspond to the landing pad LP.

The storage pad 160 may overlap a portion of a top surface of the bit-line structure 145, and may not overlap a top surface of the bit-line structure 145.

The storage pad 160 may include, for example, at least one of semiconductor material doped with impurities, a conductive silicide compound, a conductive metal nitride and a metal.

A second interlayer insulating film 180 may be formed on the storage pad 160, the bit-line structure 145, and the first interlayer insulating film 170. The second interlayer insulating film 180 may define areas of the storage pad 160 as a plurality of isolated areas. Further, the second interlayer insulating film 180 may be patterned to expose a portion of a top surface of the storage pad 160.

The second interlayer insulating film 180 may include an insulating material and thus may electrically insulate a plurality of areas of the storage pad 160 from each other. For example, the second interlayer insulating film 180 may include one of a silicon oxide film, a silicon nitride film, a silicon oxynitride film, and a combination thereof. The present disclosure is not limited thereto.

The capacitor 190 may be formed on the second interlayer insulating film 180. In some embodiments, the capacitor 190 may contact a top surface of the second interlayer insulating film 180. The capacitor 190 may be electrically connected to the storage pad 160. For example, the capacitor 190 may be electrically connected to the storage contact 120.

Referring to FIGS. 2 to 7, the capacitor 190 may include a lower electrode 191, a lower dielectric layer 192, an interposed electrode film 193, an upper dielectric layer 194, and an upper electrode 195.

The lower electrode 191 may have a pillar shape, for example. More specifically, the lower electrode 191 may extend in a thickness direction of the substrate 100 (e.g., a third direction Z). In FIG. 2 as a cross-section cut along the first direction X between the portion of adjacent word-lines WL in FIG. 1, the lower electrode 191 may include a top surface 191u, a first side wall 191s1, and a second side wall 191s2. The first side wall 191s1 and the second side wall 191s2 may be opposite to each other. The first side wall 191s1 and the second side wall 191s2 may be connected to one another by the top surface 191u. The top surface 191u of the lower electrode 191 may be substantially parallel to a top surface of the substrate 100.

The lower electrode 191 may include, for example, at least one of a semiconductor material doped with impurities, a conductive metal nitride such as titanium nitride, tantalum nitride or tungsten nitride, etc., a metal such as ruthenium, iridium, titanium or tantalum, etc., or a conductive metal oxide such as iridium oxide, etc. The present disclosure is not limited thereto.

The lower dielectric layer 192 is formed on the lower electrode 191. The lower dielectric layer 192 may be formed along a profile of the lower electrode 191. The lower dielectric layer 192 may extend along the first side wall 191s1, the second side wall 191s2, and the top surface 191u of the lower electrode 191. The lower dielectric layer 192 may contact the lower electrode 191. The lower dielectric layer 192 may extend across a top surface of the second interlayer insulating film 180, and may contact the top surface of the second interlayer insulating film 180.

The lower dielectric layer 192 may include, for example, at least one of zirconium oxide, hafnium oxide, or aluminum oxide.

The interposed electrode film 193 is formed on the lower dielectric layer 192. The interposed electrode film 193 may be formed between the lower dielectric layer 192 and the upper dielectric layer 194. The interposed electrode film 193 may be formed along a profile of the lower dielectric layer 192. The interposed electrode film 193 may extend along an outer side wall of the lower dielectric layer 192. The interposed electrode film 193 may be in contact with the lower dielectric layer 192.

The interposed electrode film 193 may include, for example, at least one of a semiconductor material doped with impurities, a metal, a conductive metal nitride, or a metal silicide. For example, the interposed electrode film 193 may include, for example, titanium nitride.

The upper dielectric layer 194 is formed on the interposed electrode film 193. The upper dielectric layer 194 may be formed between the lower dielectric layer 192 and the upper electrode 195. The upper dielectric layer 194 may be formed along a profile of the interposed electrode film 193. The upper dielectric layer 194 may extend along an outer side wall of the interposed electrode film 193. The upper dielectric layer 194 may be in contact with the interposed electrode film 193.

The upper dielectric layer 194 may include titanium oxide. Specifically, the upper dielectric layer 194 may include titanium oxide doped with a first metal and a second metal. The first metal may be different from the second metal.

A concentration of each of the first metal and the second metal in the upper dielectric layer 194 may decrease as the upper dielectric layer 194 extends to be away from the upper electrode 195.

For reference, graphs of FIGS. 6 and 7 illustrate a distribution of the concentration of each of the first metal and the second metal along A-B in the upper dielectric layer 194 of FIG. 5. As shown in FIGS. 6 and 7, the concentration of each of the first metal and the second metal in the upper dielectric layer 194 may decrease as the upper dielectric layer 194 extends to be away from the upper electrode 195 (e.g., in a direction from A to B in FIG. 5).

A form of the graph is only an example. The technical idea of the present disclosure is not limited thereto. For example, the concentrations of each of the first metal and the second metal may decrease in a form of a linear function graph.

The first metal may be a metal that becomes a trivalent cation in an oxide thereof. The first metal may have a bandgap energy of 5 eV greater in an oxide thereof.

The first metal may include, for example, at least one of actinium(III) oxide ($Ac_2O_3$), aluminum oxide ($Al_2O_3$), antimony trioxide ($Sb_2O_3$), arsenic trioxide ($As_2O_3$), bismuth (III) oxide ($Bi_2O_3$), boron trioxide ($B_2O_3$), cerium(III) oxide $(Ce_2O_3)$, chromium(III) oxide $(Cr_2O_3)$, cobalt(III) oxide $(Co_2O_3)$, dinitrogen trioxide $(N_2O_3)$, dysprosium(III) oxide $(Dy_2O_3)$, erbium(III) oxide $(Er_2O_3)$, europium(III) oxide $(Eu_2O_3)$, gadolinium(III) oxide $(Gd_2O_3)$, gallium(III) oxide $(Ga_2O_3)$, holmium(III) oxide $(Ho_2O_3)$, indium(III) oxide $(In_2O_3)$, iron(III) oxide $(Fe_2O_3)$, lanthanum oxide $(La_2O_3)$, lutetium(III) oxide $(Lu_2O_3)$, manganese(III) oxide $(Mn_2O_3)$, neodymium(III) oxide $(Nd_2O_3)$, nickel(III) oxide $(Ni_2O_3)$, phosphorus monoxide (PO), phosphorus trioxide $(P_4O_6)$, praseodymium(III) oxide $(Pr_2O_3)$, promethium(III) oxide $(Pm_2O_3)$, rhodium(III) oxide $(Rh_2O_3)$, samarium(III) oxide $(Sm_2O_3)$, scandium oxide $(Sc_2O_3)$, terbium(III) oxide $(Tb_2O_3)$, thallium(III) oxide $(Tl_2O_3)$, thulium(III) oxide $(Tm_2O_3)$, titanium(III) oxide $(Ti_2O_3)$, tungsten(III) oxide $(W_2O_3)$, vanadium(III) oxide $(V_2O_3)$, ytterbium(III) oxide $(Yb_2O_3)$, or yttrium(III) oxide $(Y_2O_3)$.

The second metal may be a metal that becomes a pentavalent cation in an oxide thereof. The second metal may include, for example, at least one of antimony pentoxide $(Sb_2O_5)$, arsenic pentoxide $(As_2O_5)$, niobium pentoxide $(Nb_2O_5)$, phosphorus pentoxide $(P_2O_5)$, protactinium(V) oxide $(Pa_2O_5)$, tantalum pentoxide $(Ta_2O_5)$, or vanadium(V) oxide $(V_2O_5)$.

The upper electrode 195 is formed on the upper dielectric layer 194. The upper electrode 195 may surround an outer side wall of the upper dielectric layer 194. A portion of the upper electrode 195 may be interposed between adjacent lower electrodes 191. A lowermost surface of the upper electrode 195 may be at a lower vertical level than uppermost surfaces of each of the lower electrode 191, the lower dielectric layer 192, the interposed electrode film 193, and the upper dielectric layer 194. The upper electrode 195 may contact the upper dielectric layer 194.

The upper electrode 195 may include, for example, at least one of a semiconductor material doped with impurities, a metal, a conductive metal nitride, or a metal silicide. For example, the upper electrode 195 may include, for example, titanium nitride.

Figure 8:
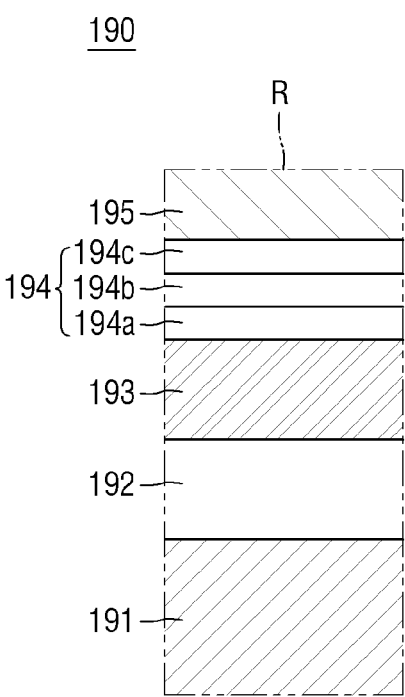
FIG. 8 is an example of an enlarged view showing area R of FIG. 4.
Figure 9:
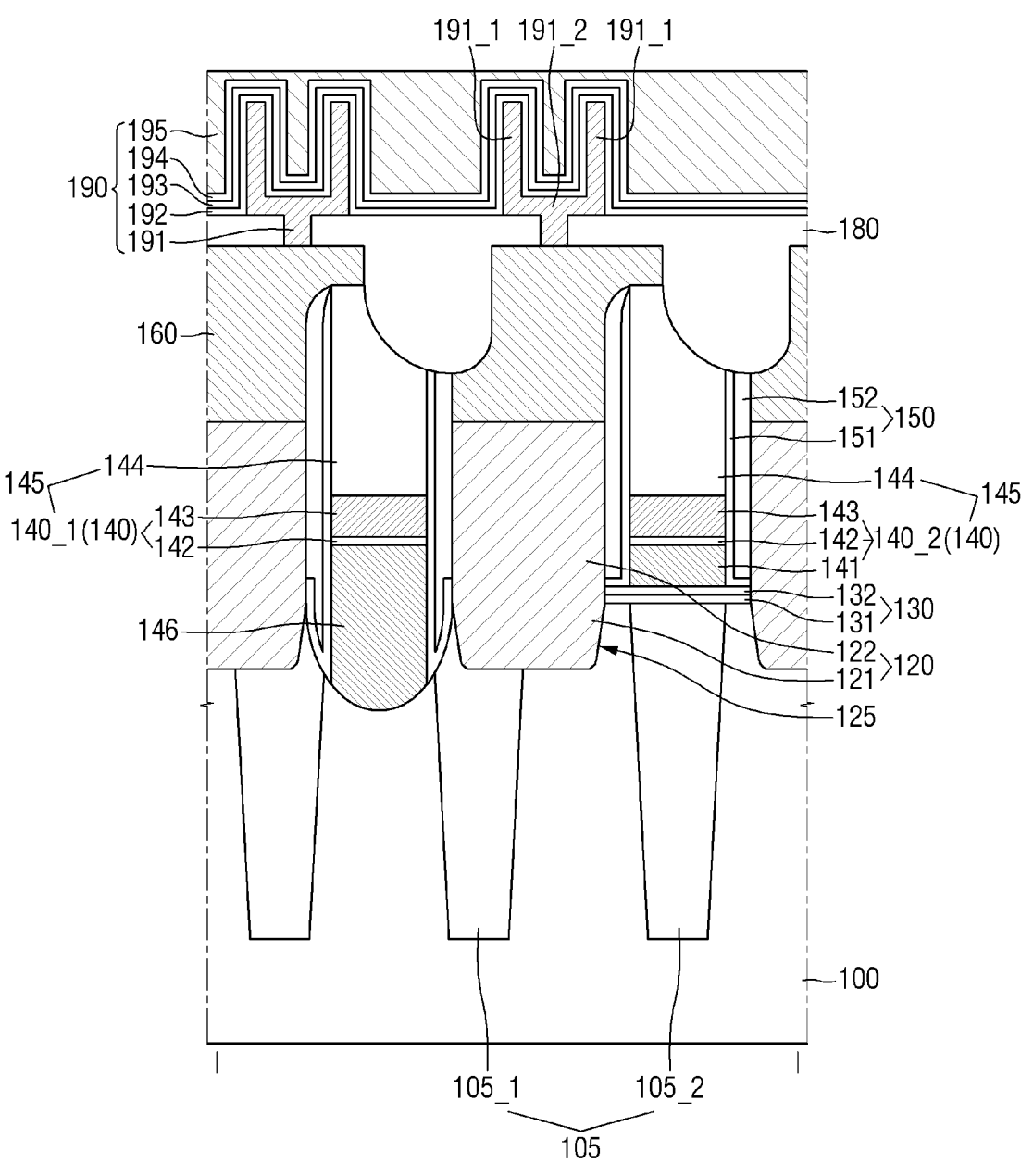
FIG. 9 is an example of a cross-sectional view taken along a line I-I of FIG. 1.

FIG. 8 is an example of an enlarged view showing area R of FIG. 4. FIG. 9 is an example of a cross-sectional view taken along a line I-I of FIG. 1.

For reference, FIG. 8 and FIG. 9 show an example of a semiconductor device according to some embodiments according to the technical spirit of the present disclosure.

Referring to FIG. 4 and FIG. 8, the upper dielectric layer 194 may be a composite film.

The upper dielectric layer 194 may include a first upper dielectric layer 194a, a second upper dielectric layer 194b, and a third upper dielectric layer 194c.

The first upper dielectric layer 194a to the third upper dielectric layer 194c may be sequentially stacked on the interposed electrode film 193. The first upper dielectric layer 194a may be formed along a profile of the interposed electrode film 193. The first upper dielectric layer 194a may extend along an outer side wall of the interposed electrode film 193. The second upper dielectric layer 194b may be formed along a profile of the first upper dielectric layer 194a. The second upper dielectric layer 194b may extend along an outer side wall of the first upper dielectric layer 194a. The second upper dielectric layer 194b may contact the first upper dielectric layer 194a. The third upper dielectric layer 194c may be formed along a profile of the second upper dielectric layer 194b. The third upper dielectric layer 194c may extend along an outer side wall of the second upper dielectric layer 194b. The third upper dielectric layer 194c may contact the second upper dielectric layer 194b.

The first upper dielectric layer 194a may include titanium oxide.

The second upper dielectric layer 194b may include an oxide of the first metal A. The oxide of the first metal A (hereinafter, first metal oxide) may be present in a form of $A_2O_3$. The first metal oxide may have a bandgap energy of 5 eV or greater.

The first metal may include, for example, at least one of actinium(III) oxide $(Ac_2O_3)$, aluminum oxide $(Al_2O_3)$, antimony trioxide $(Sb_2O_3)$, arsenic trioxide $(As_2O_3)$, bismuth (III) oxide $(Bi_2O_3)$, boron trioxide $(B_2O_3)$, cerium(III) oxide $(Ce_2O_3)$, chromium(III) oxide $(Cr_2O_3)$, cobalt(III) oxide $(Co_2O_3)$, dinitrogen trioxide $(N_2O_3)$, dysprosium(III) oxide $(Dy_2O_3)$, erbium(III) oxide $(Er_2O_3)$, europium(III) oxide $(Eu_2O_3)$, gadolinium(III) oxide $(Gd_2O_3)$, gallium(III) oxide $(Ga_2O_3)$, holmium(III) oxide $(Ho_2O_3)$, indium(III) oxide $(In_2O_3)$, iron(III) oxide $(Fe_2O_3)$, lanthanum oxide $(La_2O_3)$, lutetium(III) oxide $(Lu_2O_3)$, manganese(III) oxide $(Mn_2O_3)$, neodymium(III) oxide $(Nd_2O_3)$, nickel(III) oxide $(Ni_2O_3)$, phosphorus monoxide (PO), phosphorus trioxide $(P_4O_6)$, praseodymium(III) oxide $(Pr_2O_3)$, promethium(III) oxide $(Pm_2O_3)$, rhodium(III) oxide $(Rh_2O_3)$, samarium(III) oxide $(Sm_2O_3)$, scandium oxide $(Sc_2O_3)$, terbium(III) oxide $(Tb_2O_3)$, thallium(III) oxide $(Tl_2O_3)$, thulium(III) oxide $(Tm_2O_3)$, titanium(III) oxide $(Ti_2O_3)$, tungsten(III) oxide $(W_2O_3)$, vanadium(III) oxide $(V_2O_3)$, ytterbium(III) oxide $(Yb_2O_3)$, or yttrium(III) oxide $(Y_2O_3)$.

The third upper dielectric layer 194c may include an oxide of the second metal B (hereinafter, second metal oxide). The second metal may be different from the first metal. The second metal oxide may be present in a form of $B_2O_5$.

The second metal may include, for example, at least one of antimony pentoxide $(Sb_2O_5)$, arsenic pentoxide $(As_2O_5)$, niobium pentoxide $(Nb_2O_5)$, phosphorus pentoxide $(P_2O_5)$, protactinium(V) oxide $(Pa_2O_5)$, tantalum pentoxide $(Ta_2O_5)$, or vanadium(V) oxide $(V_2O_5)$.

Referring to FIG. 9, the lower electrode 191 may have a cylindrical shape, for example. More specifically, the lower electrode 191 may include a hollow side wall portion 191_1 extending in a thickness direction of the substrate 100 and a bottom portion 191_2 parallel to a top surface of the substrate 100. The bottom portion 191_2 of the lower electrode may be connected to a bottom of the hollow side wall portion 191_1 of the lower electrode.

The lower dielectric layer 192 is formed on the lower electrode 191. The lower dielectric layer 192 may be formed along a profile of the lower electrode 191. The lower dielectric layer 192 may be formed along an outer side wall and an inner side wall of the lower electrode 191. A portion of the lower dielectric layer 192 may be interposed into a hollow space of the hollow side wall portion 191_1 of the lower electrode.

The interposed electrode film 193 is formed on the lower dielectric layer 192. The interposed electrode film 193 may be formed along a profile of the lower dielectric layer 192. The interposed electrode film 193 may extend along an outer side wall of the lower dielectric layer 192. A portion of the interposed electrode film 193 may be interposed into the hollow space of the side wall portion 191_1 of the lower electrode.

The upper dielectric layer 194 is formed on the interposed electrode film 193. The upper dielectric layer 194 may be formed along a profile of the interposed electrode film 193. The upper dielectric layer 194 may extend along an outer side wall of the interposed electrode film 193. A portion of the upper dielectric layer 194 may be interposed into the hollow space of the side wall portion 191_1 of the lower electrode.

The upper electrode 195 is formed on the upper dielectric layer 194. The upper electrode 195 may cover an outer side wall of the upper dielectric layer 194. A portion of the upper electrode 195 may be interposed between adjacent lower electrodes 191. A portion of the upper electrode 195 may be interposed into a hollow space of the side wall portion 191_1 of the lower electrode.

Figure 10:
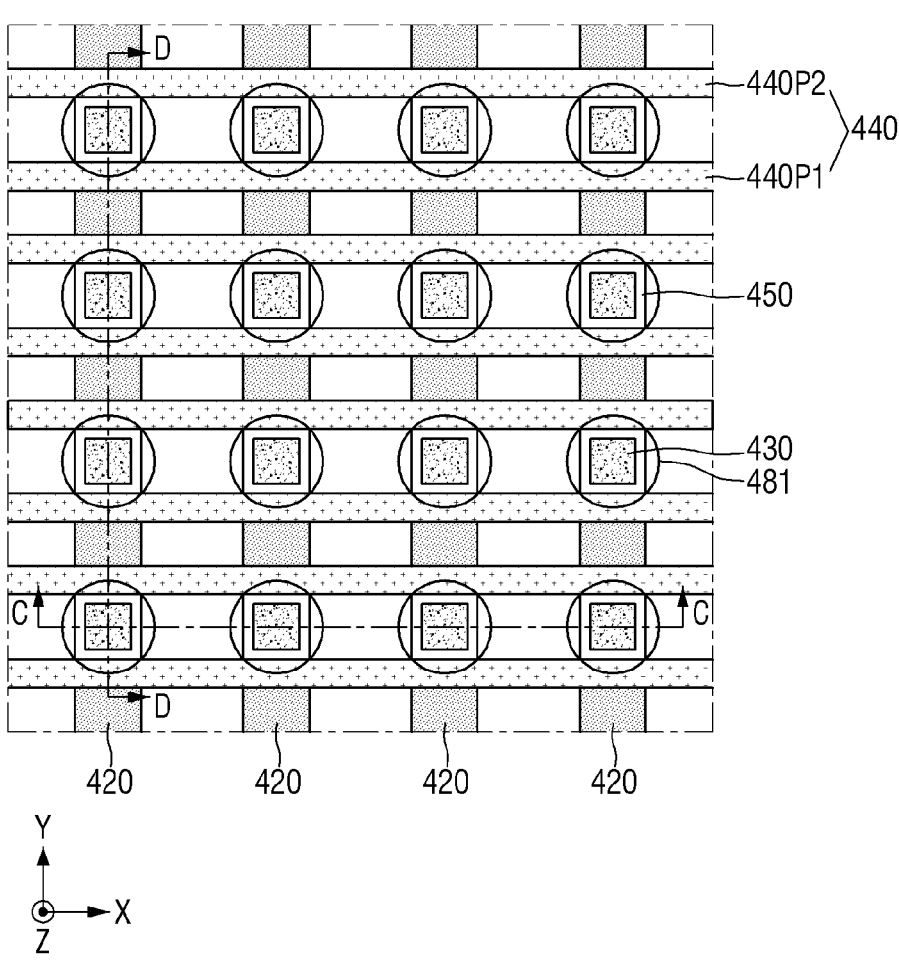
FIG. 10 is an example of a layout for illustrating a semiconductor device, according to example embodiments.
Figure 11:
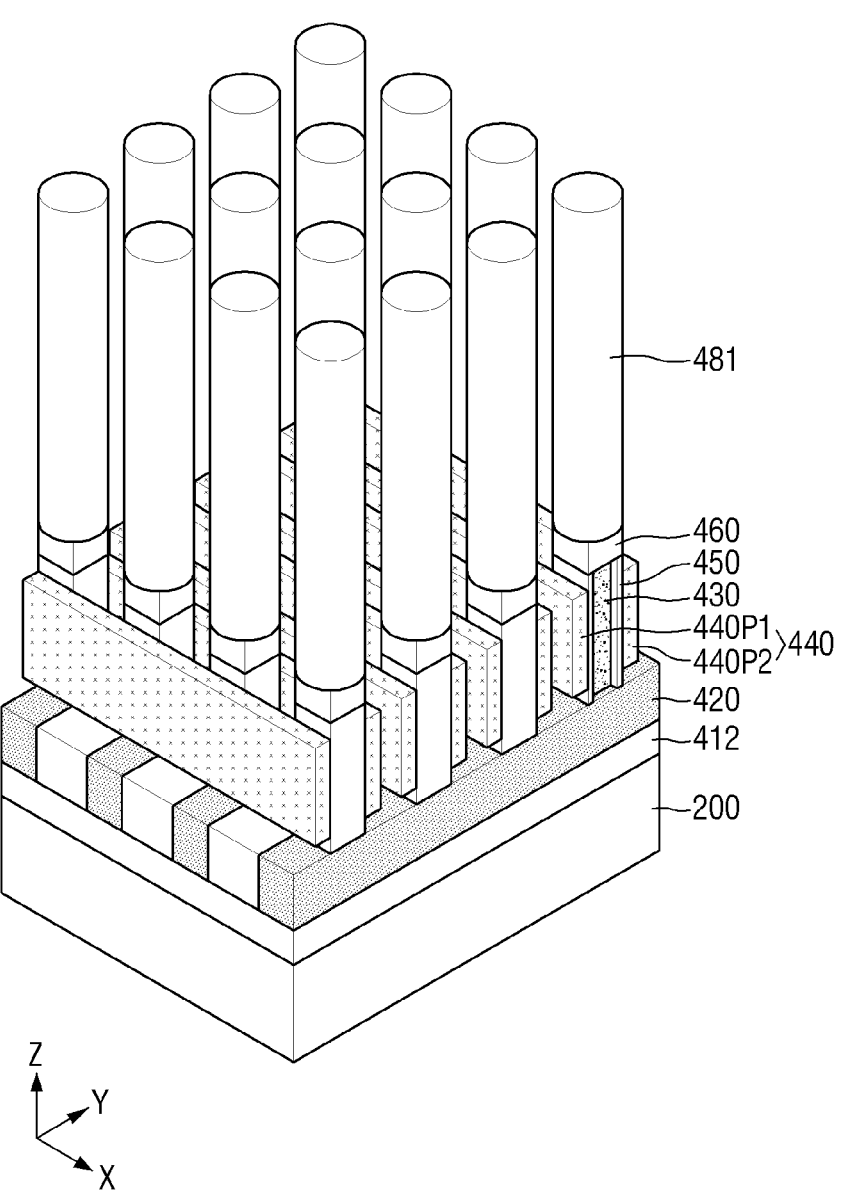
FIG. 11 is a perspective view for illustrating a semiconductor device, according to example embodiments.
Figure 12:
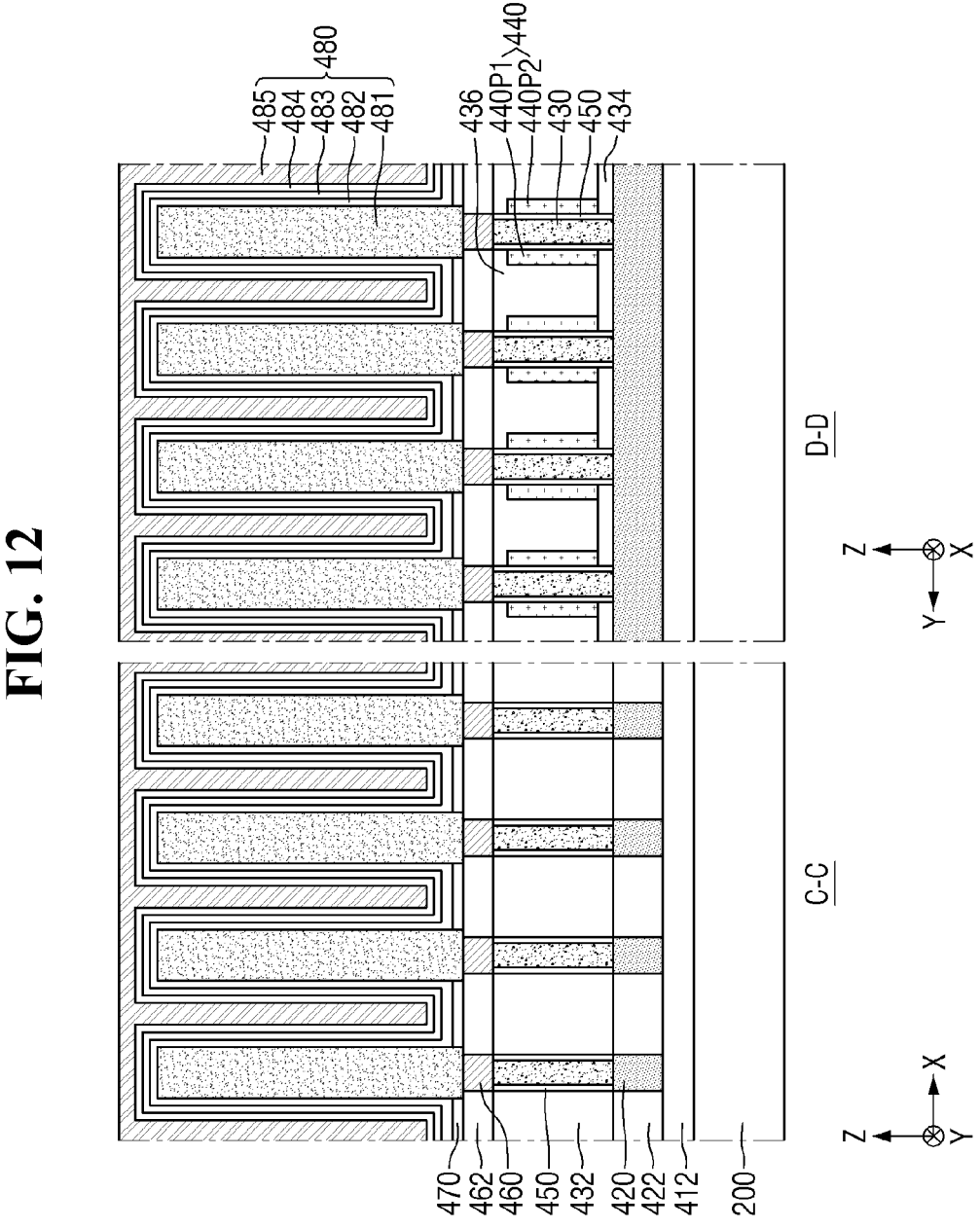
FIG. 12 is cross-sectional views taken along a line C-C and a line D-D of FIG. 10.

FIG. 10 is an example of a layout for illustrating a semiconductor device according to some embodiments. FIG. 11 is a perspective view for illustrating a semiconductor device according to example embodiments. FIG. 12 is cross-sectional views taken along a line C-C and a line D-D of FIG. 10.

For convenience of illustration, duplicates with those as described using FIGS. 1 to 9 are simplified or omitted.

Referring to FIGS. 10 to 12, a semiconductor memory device according to some embodiments may be a memory device including a vertical channel transistor (VCT). The vertical channel transistor may refer to a structure in which a channel length of a channel layer 430 extends from the substrate 200 and along a vertical direction (e.g., in a direction perpendicular to a top surface of the substrate 200).

The semiconductor device according to some embodiments may include a substrate 200, a plurality of first line conductive films 420, the channel layer 430, a gate electrode 440, a gate insulating film 450, and a capacitor 480.

A lower insulating layer 412 may be disposed on the substrate 200. The plurality of first line conductive films 420 may be disposed on the lower insulating layer 412 and may be spaced apart from each other in the first direction X and extend lengthwise in the second direction Y. A plurality of first insulating patterns 422 may be disposed on the lower insulating layer 412 so as to fill a space between adjacent ones of the plurality of first line conductive films 420. The plurality of first insulating patterns 422 may extend lengthwise in the second direction Y. A top surface of the plurality of first insulating patterns 422 may be disposed at the same level as a top surface of the plurality of first line conductive films 420. Each of the plurality of first line conductive films 420 may function as a bit-line.

Each of the plurality of first line conductive films 420 may include at least one of a semiconductor material doped with impurities, a metal, a conductive metal nitride, a conductive metal silicide, a conductive metal oxide, or a combination thereof. For example, each of the plurality of first line conductive films 420 may include at least one of polysilicon doped with impurities, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but may not be limited thereto. Each of the plurality of first line conductive films 420 may include a single layer or multiple layers made of the aforementioned materials. In some embodiments, each of the plurality of first line conductive films 420 may include graphene, carbon nanotube, or a combination thereof The channel layer 430 may have a matrix form in which channels are spaced apart from each other in each of the first direction X and the second direction Y and are disposed on the plurality of first line conductive films 420, respectively. Each channel of the channel layer 430 may have a first width in the first direction X and a first vertical dimension in the third direction Z, wherein the first vertical dimension may be greater than the first width. In this connection, the third direction Z may intersect the first direction X and the second direction Y, and may be, for example, a direction perpendicular to a top surface of the substrate 200. For example, the first vertical dimension may be about 2 to 10 times of the first width. However, the disclosure is not limited thereto. A bottom portion of each channel of the channel layer 430 may function as a third source/drain area (not shown), while a top portion of each channel of the channel layer 430 may function as a fourth source/drain area (not shown). A portion of each channel of the channel layer 430 between the third and fourth source/drain areas may function as a channel area (not shown).

In some embodiments, the channel layer 430 may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_x-In_yZn_zO$, $Ga_xZn_ySn_zO$, $Al_xZn_ySn_zO$, $Yb_xGa_yZn_zO$, $In_xGa_yO$, or combinations thereof. The channel layer 430 may include a single layer or multiple layers made of the oxide semiconductor. In some examples, the channel layer 430 may have a bandgap energy greater than that of silicon. For example, the channel layer 430 may have a bandgap energy of about 1.5 eV to about 5.6 eV. For example, the channel layer 430 may have optimal channel performance when the layer 430 has a bandgap energy of about 2.0 eV to 4.0 eV. For example, the channel layer 430 may be made of polycrystalline or amorphous, but may not be limited thereto. In some embodiments, the channel layer 430 may include graphene, carbon nanotubes, or a combination thereof.

The gate electrode 440 may extend lengthwise in the first direction X and may be formed on both side walls of each channel of the channel layer 430. The gate electrode 440 may include a first sub-gate electrode 440P1 facing toward a first side wall of the channel layer 430, and a second sub-gate electrode 440P2 facing toward a second side wall opposite to the first side wall of the channel layer 430. As one channel of the channel layer 430 is disposed between the first sub-gate electrode 440P1 and the second sub-gate electrode 440P2, the semiconductor device may have a dual gate transistor structure. However, the technical spirit of the present disclosure is not limited thereto. The second sub-gate electrode 440P2 may be omitted and thus only the first sub-gate electrode 440P1 facing toward the first side wall of the channel layer 430 may be formed, so that a single gate transistor structure may be implemented. Description of a material of the gate electrode 440 may be the same as the description of the gate electrode 112.

The gate insulating film 450 surrounds a side wall of each channel of the channel layer 430 and may be interposed between each channel of the channel layer 430 and the gate electrode 440. For example, as shown in FIG. 10, an entirety of a side wall of each channel of the channel layer 430 may be surrounded with the gate insulating film 450, and a portion of a side wall of the gate electrode 440 may contact the gate insulating film 450. In other embodiments, the gate insulating film 450 may extend in an extension direction of the gate electrode 440, that is, the first direction X, and only two side walls facing toward the gate electrode 440 among all of side walls of each channel of the channel layer 430 may contact the gate insulating film 450. In some embodiments, the gate insulating film 450 may be embodied as a silicon oxide film, a silicon oxynitride film, a film made of a high dielectric constant material having a dielectric constant higher than that of the silicon oxide film, or a combination thereof.

A plurality of second insulating patterns 432 may extend lengthwise along the second direction Y and may be disposed on the plurality of first insulating patterns 422, respectively. Each channel of the channel layer 430 may be disposed between adjacent two second insulating patterns 432 of the plurality of second insulating patterns 432. Further, a first buried layer 434 and a second buried layer 436 may be disposed between two adjacent second insulating patterns 432 and in a space between two adjacent channels of the channel layer 430. The first buried layer 434 may occupy a bottom portion of a space between two adjacent channels of the channel layer 430. Bottom surfaces of the first and second sub-gate electrodes 440P1 and 440P2 may contact a top surface of the first buried layer 434. Side surfaces of the first buried layer 434 may contact side surfaces of the gate insulating film 450. The second buried layer 436 may be formed to fill a remainder of the space between the two adjacent channels of the channel layer 430 and may be disposed on the first buried layer 434. A top surface of the second buried layer 436 may be coplanar with a top surface of the channel layer 430, and the second buried layer 436 may cover a top surface of the gate electrode 440. Alternatively, each of the plurality of second insulating pattern 432 and each of the plurality of first insulating patterns 422 may constitute a continuous material layer and thus may be monolithic. Alternatively, the second buried layer 436 and the first buried layer 434 may constitute a continuous material layer and thus may be monolithic.

Each capacitor contact 460 may be disposed on each channel of the channel layer 430. Each capacitor contact 460 may vertically overlap each channel of the channel layer 430. For example, a bottom surface of each capacitor contact 460 may contact top surfaces of the corresponding channel layer 430 and the gate insulating film 450 that surrounds the channel layer 430. Thus, the capacitor contacts 460 may be arranged in a matrix form in which the capacitor contacts 460 are spaced apart from each other in each of the first direction X and the second direction Y. The capacitor contact 460 may include at least one of polysilicon doped with impurities, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but may not be limited thereto. An upper insulating layer 462 may surround a side wall of each capacitor contact 460 and may be disposed on the plurality of second insulating patterns 432 and the second buried layer 436. For example, a bottom surface of the upper insulating layer 462 may contact top surfaces of the plurality of second insulating patterns 432.

An etching stop film 470 may be disposed on the upper insulating layer 462. A bottom surface of the etching stop film 470 may contact a top surface of the upper insulating layer 462. The capacitor 480 may be disposed on the etching stop film 470. Description of the capacitor 480 may be the same as that of the capacitor 190 as described using FIGS. 1 to 8.

The capacitor 480 may include a lower electrode 481, a lower dielectric layer 482, an interposed electrode film 483, an upper dielectric layer 484, and an upper electrode 485.

The lower electrode 481 may extend through the etching stop film 470 and be electrically connected to a top surface of the capacitor contact 460. For example, a bottom surface of the lower electrode 481 may contact the top surface of the capacitor contact 460. The lower electrode 481 may be formed in a pillar shape extending in the third direction Z. However, the disclosure is not limited thereto. In some embodiments, the lower electrode 481 may vertically overlap the capacitor contact 460. The lower electrodes 481 may be arranged in a matrix form in which the lower electrode 481 are spaced apart from each other in each of the first direction X and the second direction Y. Alternatively, a landing pad (not shown) may be further disposed between the capacitor contact 460 and the lower electrode 481, and the lower electrodes 481 may be arranged in a hexagonal shape.

Figure 13:
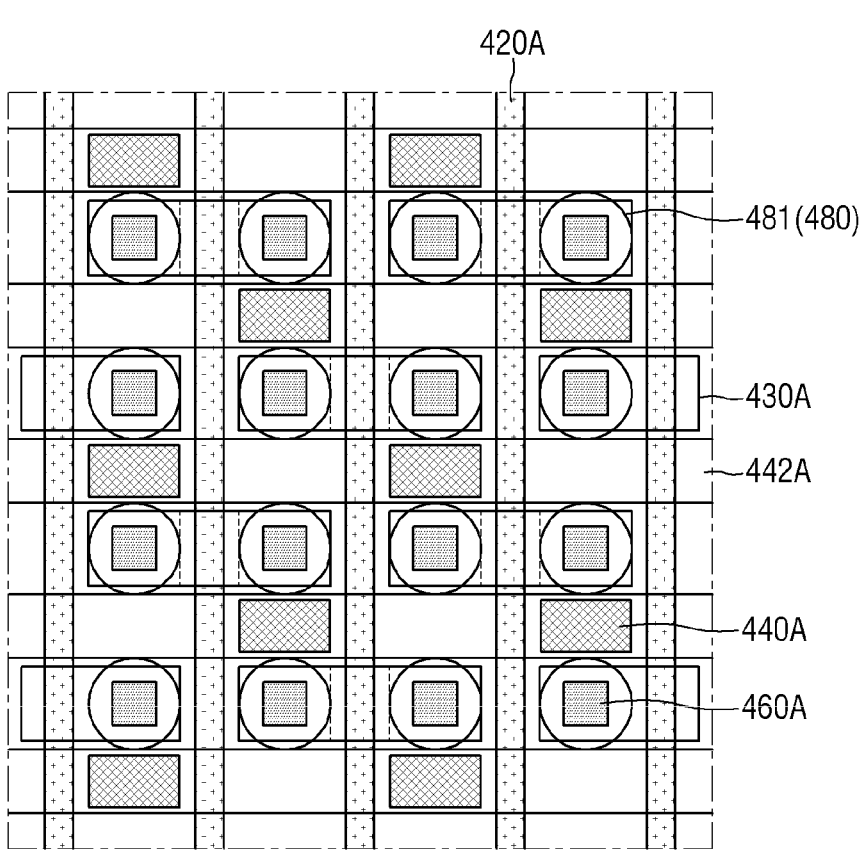
FIG. 13 is a layout for illustrating a semiconductor device, according to example embodiments.
Figure 13:
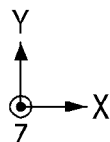
Figure 14:
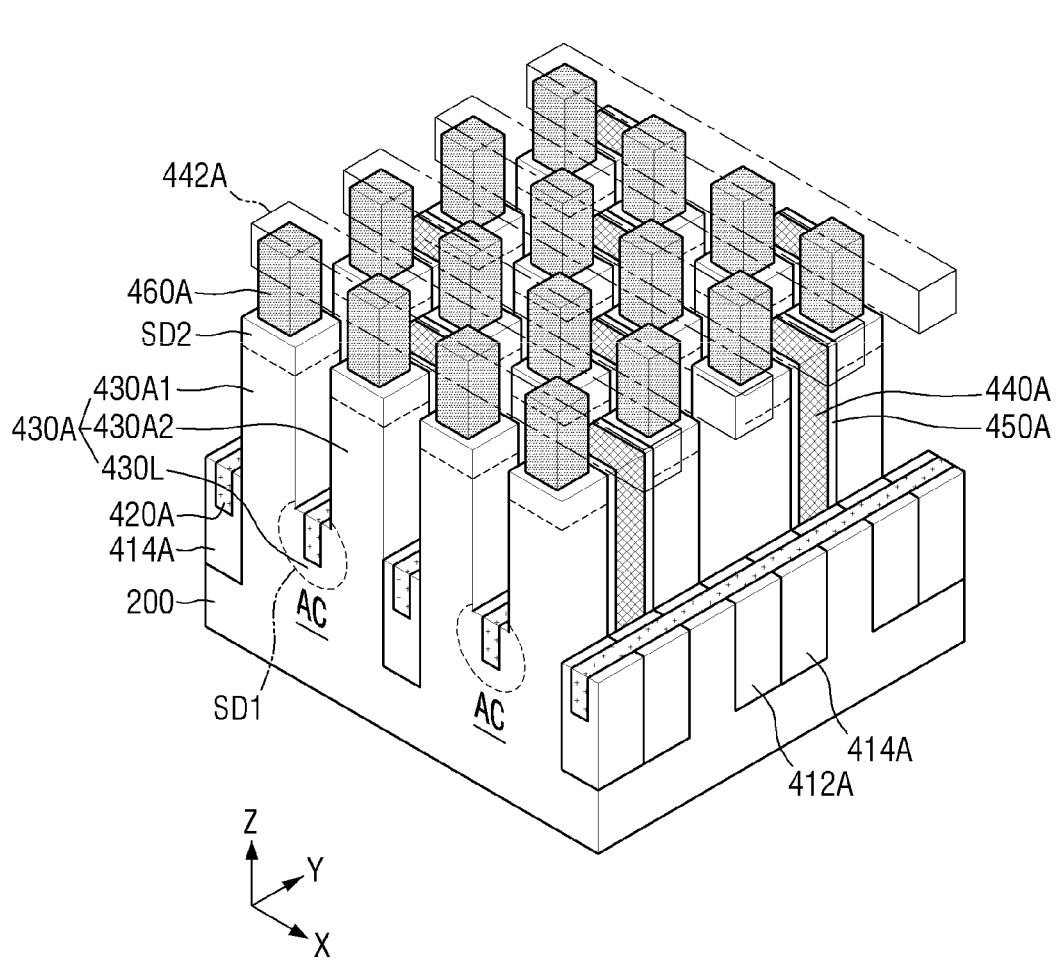
FIG. 14 is a perspective view for illustrating a semiconductor device, according to example embodiments.

FIG. 13 is a layout for illustrating a semiconductor device according to example embodiments. FIG. 14 is a perspective view for illustrating a semiconductor device according to some embodiments.

For convenience of illustration, duplicates with those as described using FIGS. 1 to 9 are simplified or omitted.

Referring to FIG. 13 and FIG. 14, a semiconductor memory device according to some embodiments may include a substrate 200, a plurality of first line conductive films 420A, a channel structure 430A, a contact gate electrode 440A, a plurality of second line conductive films 442A, and a capacitor 480.

The semiconductor memory device according to some embodiments may be a memory device including a vertical channel transistor (VCT).

A plurality of second active areas AC may be defined in the substrate 200 by a first element separation pattern 412A and a second element separation pattern 414A. The channel structure 430A may be disposed in each of the second active areas AC. The channel structure 430A may include a first active pillar 430A1 and a second active pillar 430A2 extending in a vertical direction (e.g., in a direction perpendicular to a top surface of the substrate 200), and a connector 430L connected to a bottom portion of the first active pillar 430A1 and a bottom portion of the second active pillar 430A2. A first source/drain area SD1 may be disposed in the connector 430L. A second source/drain area SD2 may be disposed in a top portion of each of the first and second active pillars 430A1 and 430A2. Each of the first active pillar 430A1 and the second active pillar 430A2 may constitute an independent unit memory cell.

The plurality of first line conductive films 420A may extend in a direction intersecting the plurality of second active areas AC. For example, the plurality of first line conductive films 420A may extend lengthwise in the second direction Y. One of the plurality of first line conductive films 420A may be disposed on the connector 430L and between the first active pillar 430A1 and the second active pillar 430A2. One first line conductive film 420A may be disposed on the first source/drain area SD1. Another first line conductive film 420A adjacent to said one first line conductive film 420A may be disposed between two channel structures 430A. One first line conductive film 420A of the plurality of first line conductive films 420A may function as a common bit-line commonly included in two unit memory cells respectively corresponding to the first active pillar 430A1 and the second active pillar 430A2 respectively disposed on both sides of said one first line conductive film 420A.

One contact gate electrode 440A may be disposed between two channel structures 430A adjacent to each other in the second direction Y. For example, the contact gate electrode 440A may be disposed between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 respectively disposed on both side walls thereof. The gate insulating film 450A may be disposed between the contact gate electrode 440A and the first active pillar 430A1 and between the contact gate electrode 440A and the second active pillar 430A2. For example, the gate insulating film 450A may contact side surface of the contact gate electrode 440A and the first and second active pillars 430A1 and 430A2. The plurality of second line conductive films 442A may extend lengthwise in the first direction X. Each second line conductive films 442A may be disposed on a top surface of each contact gate electrode 440A. Each of the plurality of second line conductive films 442A may function as a word-line of a semiconductor device.

A capacitor contact 460A may be disposed on the channel structure 430A. The capacitor contact 460A may be disposed on the second source/drain area SD2. The capacitor 480 may be disposed on the capacitor contact 460A.

Description of the capacitor 480 may be the same as that of the capacitor 190 as described using FIGS. 1 to 8. For example, the capacitor 480 may include the lower electrode 481, the lower dielectric layer 482, the interposed electrode film 483, the upper dielectric layer 484, and the upper electrode 485.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
a lower electrode;
a lower dielectric layer on the lower electrode;
an upper electrode on the lower dielectric layer;
an upper dielectric layer formed between the lower dielectric layer and the upper electrode; and
an interposed electrode film formed between the lower dielectric layer and the upper dielectric layer,
wherein the upper dielectric layer includes titanium oxide,
wherein an uppermost upper surface of the lower electrode is at a higher level than a lowermost upper surface of the upper dielectric layer,
wherein a lowermost lower surface of the lower electrode is at a lower level than a lowermost lower surface of the lower dielectric layer,
wherein the upper dielectric layer includes the titanium oxide doped with a first metal and a second metal different from the first metal, and
wherein a concentration of each of the first metal and the second metal in the upper dielectric layer decreases as the upper dielectric layer extends away from the upper electrode.

2. The device of claim 1,
wherein the first metal includes a metal that becomes a trivalent cation in an oxide thereof, and
wherein the second metal includes a metal that becomes a pentavalent cation in an oxide thereof.

3. The device of claim 1, wherein the first metal is aluminum (Al), and the second metal is niobium (Nb).

4. The device of claim 1,
wherein the upper dielectric layer includes a first upper dielectric layer, a second upper dielectric layer, and a third upper dielectric layer sequentially stacked on the interposed electrode film,
wherein the first upper dielectric layer includes titanium oxide,
wherein the second upper dielectric layer includes a first metal oxide,
wherein the third upper dielectric layer includes a second metal oxide, wherein a first metal of the first metal oxide is represented by A, and a second metal of the second metal oxide is represented by B, wherein the first metal is different from the second metal,
wherein the first metal oxide is present in a form of $A_2O_3$, and
wherein the second metal oxide is present in a form of $B_2O_5$.

5. The device of claim 4, wherein the first metal oxide has a bandgap energy of 5 eV or greater.

6. The device of claim 4, wherein the first metal is aluminum, and the second metal is niobium.

7. The device of claim 1, wherein the lower dielectric layer includes at least one of zirconium oxide, hafnium oxide, or aluminum oxide.

8. A semiconductor device comprising:
a lower conductive layer;
a first dielectric layer disposed on the lower conductive layer;
a first conductive layer disposed on the first dielectric layer and in contact with the first dielectric layer;
a second dielectric layer disposed on the first conductive layer and in contact with the first conductive layer; and
a second conductive layer disposed on the second dielectric layer and in contact with the second dielectric layer,
wherein each of the first conductive layer and the second conductive layer includes titanium nitride (TiN),
wherein the first dielectric layer includes at least one of zirconium oxide, hafnium oxide, or aluminum oxide, and
wherein the second dielectric layer includes titanium oxide doped with a first metal and a second metal different from the first metal,
wherein a concentration of each of the first metal and the second metal in the second dielectric layer decreases as the second dielectric layer extends away from the second conductive layer,
wherein an uppermost upper surface of the lower conductive layer is at a higher level than a lowermost upper surface of the second conductive layer, and
wherein a lowermost lower surface of the lower conductive layer is at a lower level than a lowermost lower surface of the first dielectric layer.

9. The device of claim 8,
wherein the first metal includes a metal that becomes a trivalent cation in an oxide thereof,
wherein the second metal includes a metal that becomes a pentavalent cation in an oxide thereof, and
wherein the oxide of the first metal has a bandgap energy of 5 eV or greater.

10. A semiconductor device comprising:
a substrate;
a trench defined in the substrate;
a gate electrode filling a portion of the trench;
a buried contact disposed on at least one side of the gate electrode and connected to the substrate;
a landing pad disposed on and contacting the buried contact; and
a capacitor connected to the landing pad,
wherein the capacitor includes:
a lower electrode including a first side wall and a second side wall opposite to each other;
a lower dielectric layer extending along the first side wall, the second side wall, and a top surface of the lower electrode;
an interposed electrode film disposed on the lower dielectric layer, wherein the interposed electrode film is in contact with the lower dielectric layer and extends along a profile of the lower dielectric layer;

an upper dielectric layer disposed on the interposed electrode film, wherein the upper dielectric layer is in contact with the interposed electrode film and extends along a profile of the interposed electrode film; and an upper electrode disposed on the upper dielectric layer and covering the upper dielectric layer, and wherein the upper dielectric layer includes titanium oxide, wherein an uppermost upper surface of the lower electrode is at a higher level than a lowermost upper surface of the upper dielectric layer, wherein a lowermost lower surface of the lower electrode is at a lower level than a lowermost lower surface of the lower dielectric layer, and wherein the lowermost lower surface of the lower electrode contacts an upper surface of the landing pad, wherein the upper dielectric layer includes the titanium oxide doped with a first metal and a second metal different from the first metal, and wherein a concentration of each of the first metal and the second metal in the upper dielectric layer decreases as the upper dielectric layer extends away from the upper electrode.

11. The device of claim 10, wherein the first metal includes a metal that becomes a trivalent cation in an oxide thereof, and wherein the second metal includes a metal that becomes a pentavalent cation in an oxide thereof.

12. The device of claim 10, wherein the first metal is aluminum (Al), and the second metal is niobium (Nb).

13. The device of claim 10, wherein the upper dielectric layer includes a first upper dielectric layer, a second upper dielectric layer, and a third upper dielectric layer sequentially stacked on the interposed electrode film, wherein the first upper dielectric layer includes titanium oxide, wherein the second upper dielectric layer includes a first metal oxide, wherein the third upper dielectric layer includes a second metal oxide, wherein a first metal of the first metal oxide is represented by A, and a second metal of the second metal oxide is represented by B, wherein the first metal is different from the second metal, wherein the first metal oxide is present in a form of $A_2O_3$, and wherein the second metal oxide is present a form of $B_2O_5$.

14. The device of claim 13, wherein the first metal oxide has a bandgap energy of 5 eV or greater.

15. The device of claim 13, wherein the first metal is aluminum, and the second metal is niobium.

16. The device of claim 10, wherein the lower dielectric layer includes at least one of zirconium oxide, hafnium oxide, or aluminum oxide.

* * * * *